US011230760B2

United States Patent
Fujii et al.

(10) Patent No.: US 11,230,760 B2
(45) Date of Patent: Jan. 25, 2022

(54) SPUTTERING APPARATUS AND METHOD OF FORMING FILM

(71) Applicant: ULVAC, INC., Kanagawa (JP)

(72) Inventors: Yoshinori Fujii, Kanagawa (JP); Shinya Nakamura, Kanagawa (JP)

(73) Assignee: ULVAC, INC., Kanagawa (JP)

(*) Notice: Subject to any disclaimer, the term of this patent is extended or adjusted under 35 U.S.C. 154(b) by 0 days.

(21) Appl. No.: 15/733,976

(22) PCT Filed: Jul. 23, 2019

(86) PCT No.: PCT/JP2019/028777
§ 371 (c)(1),
(2) Date: Dec. 1, 2020

(87) PCT Pub. No.: WO2020/044872
PCT Pub. Date: Mar. 5, 2020

(65) Prior Publication Data
US 2021/0214841 A1      Jul. 15, 2021

(30) Foreign Application Priority Data
Aug. 27, 2018 (JP) .............................. JP2018-158803

(51) Int. Cl.
*C23C 14/34* (2006.01)
*C23C 14/35* (2006.01)

(52) U.S. Cl.
CPC .......... *C23C 14/3407* (2013.01); *C23C 14/35* (2013.01)

(58) Field of Classification Search
CPC .. H01J 37/345; H01J 37/3452; H01J 37/3455; H01J 37/347; H01J 37/3473; C23C 14/35; C23C 14/54

USPC ............................ 204/192.13, 298.03, 298.2
See application file for complete search history.

(56) References Cited

U.S. PATENT DOCUMENTS

2015/0368792 A1* 12/2015 Rieschl ............... H01J 37/3467
204/192.12

FOREIGN PATENT DOCUMENTS

| JP | 2013-185254 A | 9/2013 |
| JP | 2016-011445 A | 1/2016 |
| JP | 2016-157820 A | 9/2016 |

OTHER PUBLICATIONS

Machine Translation JP 2016-011445 (Year: 2016).*
(Continued)

*Primary Examiner* — Rodney G McDonald
(74) *Attorney, Agent, or Firm* — Cermak Nakajima & McGowan LLP; Tomoko Nakajima

(57) ABSTRACT

A sputtering apparatus SM has: a vacuum chamber in which a substrate and a target are disposed to lie opposite to each other; a plasma generating means generating a plasma inside the vacuum chamber; and a magnet unit disposed above the target. The magnet unit has a plurality of magnets with different polarities on a substrate side. A leakage magnetic field in which a line passing through a position where a vertical component of the magnetic field becomes zero is closed in an endless manner, is caused to locally act on such a space below the target as is positioned between the center of the target and a periphery thereof. The magnet unit is divided, on an imaginary line extending from the center of the target toward a periphery thereof, into a plurality of segments each having a plurality of magnets.

3 Claims, 5 Drawing Sheets

(56) References Cited

OTHER PUBLICATIONS

Machine Translation JP 2016-157820 (Year: 2016).*
International Search Report for PCT Patent App. No. PCT/JP2019/028777 (dated Oct. 8, 2019).

* cited by examiner

41a  ← Δθ →  41b 41a  41b 41a
41b

SPUTTERING APPARATUS AND METHOD OF FORMING FILM

This application is a national phase entry under 35 U.S.C. § 371 of PCT Patent Application No. PCT/JP2019/028777, filed on Jul. 23, 2019, which claims priority under 35 U.S.C. § 119 to Japanese Patent Application No. 2018-158803, filed on Aug. 27, 2018, both of which are incorporated by reference.

TECHNICAL FIELD

The present invention relates to a sputtering apparatus provided with: a vacuum chamber in which a substrate to be processed and a target are disposed in a manner to lie opposite to each other; a plasma generating means for generating a plasma inside the vacuum chamber; and, provided that a direction inside the vacuum chamber from the substrate toward the target is defined to be "upward", a magnet unit disposed above the target.

BACKGROUND ART

This kind of sputtering apparatus is known in, e.g., patent document 1. In the sputtering apparatus in question, in order to prevent the central region inclusive of the center of the target from getting locally eroded, there is caused to locally act, on such a space below the target as is positioned between the center of the target and a periphery thereof, a magnetic field in which a line passing through the position at which the vertical component of the magnetic field becomes zero is closed in an endless manner. By causing a high-density plasma to be generated along this line closed in an endless manner, the target gets sputtered by the ions in the plasma. The sputtered particles scattered out of the target by sputtering get adhered to, and deposited on, the surface of the substrate, thereby forming a thin film thereon. During film forming, by driving to rotate the magnet unit about the center of the target so as to vary the region in which the leakage magnetic field acts on the target, the target gets eroded uniformly over the entire surface thereof, and the utilization efficiency of the target is improved.

By the way, when the sputtering conditions such as the material of the target, the pressure inside the vacuum chamber, and the like are different, the scattering distribution of the sputtered particles will vary and, as a result, there is a possibility that, for example, the film thickness distribution varies in the circumferential direction (hereinafter called "circumferential film thickness distribution") at the outer periphery of the substrate. A method of adjusting the change in the circumferential film thickness distribution is known in, e.g., patent document 2. According to this method, provided that the time for the region in which the magnetic field locally acts on the target moves from an origin back to the origin in question by moving on the same orbit is defined as one cycle, the orbit of the magnet unit in one cycle is divided into a plurality of zones. At least one zone out of these plurality of zones is defined as a reference zone which moves at a predetermined reference speed, and a rotational speed (amount of acceleration or amount of deceleration from the reference speed) is determined based on the film thickness distribution for each of the zones except for the reference zone.

However, according to the above-mentioned known art, it is only that the magnet unit is integrally (i.e., as one set) increased or decreased in the rotational speed. Therefore, for example, if an adjustment is made to the circumferential film thickness distribution at the outer periphery of the substrate, there is a possibility that the circumferential film thickness distribution in the inner periphery on the inner side of the outer periphery of the substrate (particularly the region near the center of the substrate) will be all the more deteriorated thereby.

PRIOR ART DOCUMENTS

Patent Documents

Patent Document 1: JP-2016-157820-A
Patent Document 2: JP-2016-011445-A

SUMMARY OF THE INVENTION

Problems that the Invention is to Solve

In view of the above-mentioned points, this invention has a problem of providing a sputtering apparatus and a film forming method in which a further uniform film thickness distribution can be obtained over the entire surface of the substrate.

Means for Solving the Problems

In order to solve the above-mentioned problems, this invention is a sputtering apparatus comprising: a vacuum chamber in which a substrate to be processed and a target are disposed to lie opposite to each other; a plasma generating means for generating a plasma inside the vacuum chamber; and provided that a direction inside the vacuum chamber from the substrate toward the target is defined to be upward, a magnet unit disposed above the target. The magnet unit has a plurality of magnets with different polarities on a substrate side, and a leakage magnetic field in which a line passing through a position where a vertical component of the magnetic field becomes zero is closed in an endless manner, is caused to locally act on such a space below the target as is positioned between a center of the target and a periphery thereof. The magnet unit is divided, on an imaginary line extending from the center of the target toward the periphery thereof, into a plurality of segments each of which having a plurality of magnets, the magnet unit comprising: a driving means for driving to rotate the respective segments about the center of the target; and an angular velocity control means for controlling the angular velocity of each of the segments within a range of maintaining the endless manner of the leakage magnetic field.

According to this invention, since an arrangement has been employed in which, when each of the segments of the magnet unit respectively moves along the same orbit around the target, the angular velocity can be controlled for each of the segments by the angular velocity determination means. Therefore, the circumferential film thickness distribution in the outer periphery of the substrate can be adjusted. As a result, in case the circumferential film thickness distribution on the inner side of the inner periphery of the substrate has deteriorated, such a segment of the magnet unit as will cause to act on the leakage magnetic field which contributes to the film formation of the inner periphery of the substrate will be decelerated in the angular velocity as to the region in which the circumferential film thickness is relatively small, thereby increasing the sputtering rate. As to the region in which the film thickness is relatively large, on the other hand, the angular velocity is accelerated, thereby decreasing the sputtering rate. In this manner, the film thickness distribution in the segment in which the film thickness distribution has been deteriorated, can be readjusted and, as a result, still more uniform film thickness distribution over the entire surface can be obtained.

Further, in order to solve the above-mentioned problems, this invention is a method of forming a film in which a substrate to be processed and a target are disposed to lie opposite to each other inside a vacuum chamber, and by generating a plasma inside the vacuum chamber, the target is sputtered to thereby form a thin film on the surface of a substrate. Provided that a direction inside the vacuum chamber from the substrate toward the target is defined to be upward, during film forming by means of a magnet unit disposed above the target, a leakage magnetic field in which a line passing through a position where a vertical component of the magnetic field becomes zero is closed in an endless manner, is caused to locally act on such a space below the target as is positioned between a center of the target and a periphery thereof. The method comprises: an information obtaining step in which by using, as the magnet unit, a plurality of segments divided on an imaginary line extending from a center of the target toward a periphery thereof, each of the segments being driven for rotating each of the segments in synchronization about the center of the target, thereby forming a thin film on the surface of the substrate, and obtaining information about an in-plane film thickness distribution of the substrate; an angular velocity determining step in which, based on such information about film thickness distribution as was obtained in the information obtaining step, an angular velocity of each of the segments is respectively determined within a range in which the endless manner of the leakage magnetic field is maintained; and a film forming step in which a thin film is formed on the surface of the substrate by driving to rotate each of the segments of the magnet unit at a rotational speed determined in the angular velocity determining step.

In this invention, in case there is performed a cycle in which a region of locally acting the leakage magnetic field on the target moves on the same orbit from an origin back to the origin is performed during film forming at least more than once, preferably: in the information obtaining step, the information is obtained about a film thickness distribution at the time of forming a thin film by rotating each of the segments of the magnet unit at a predetermined reference angular velocity; in the angular velocity determining step, the orbit of each of the segments of the magnet unit in one cycle is divided into a plurality of respective zones, at least one zone being defined as a respective reference zone and, for each of the zones other than the reference zone, an amount of acceleration or an amount of deceleration from the reference angular velocity is respectively determined based on such information about the film thickness distribution as was obtained in the information obtaining step.

MODES FOR CARRYING OUT THE INVENTION

Hereinbelow, with reference to the drawings, a description will now be made of an embodiment of the sputtering apparatus according to this invention. In the following description, the terms designating the directions such as "upper (or above)" and "lower (or below)" is based on FIG. 1.

Figure 1:
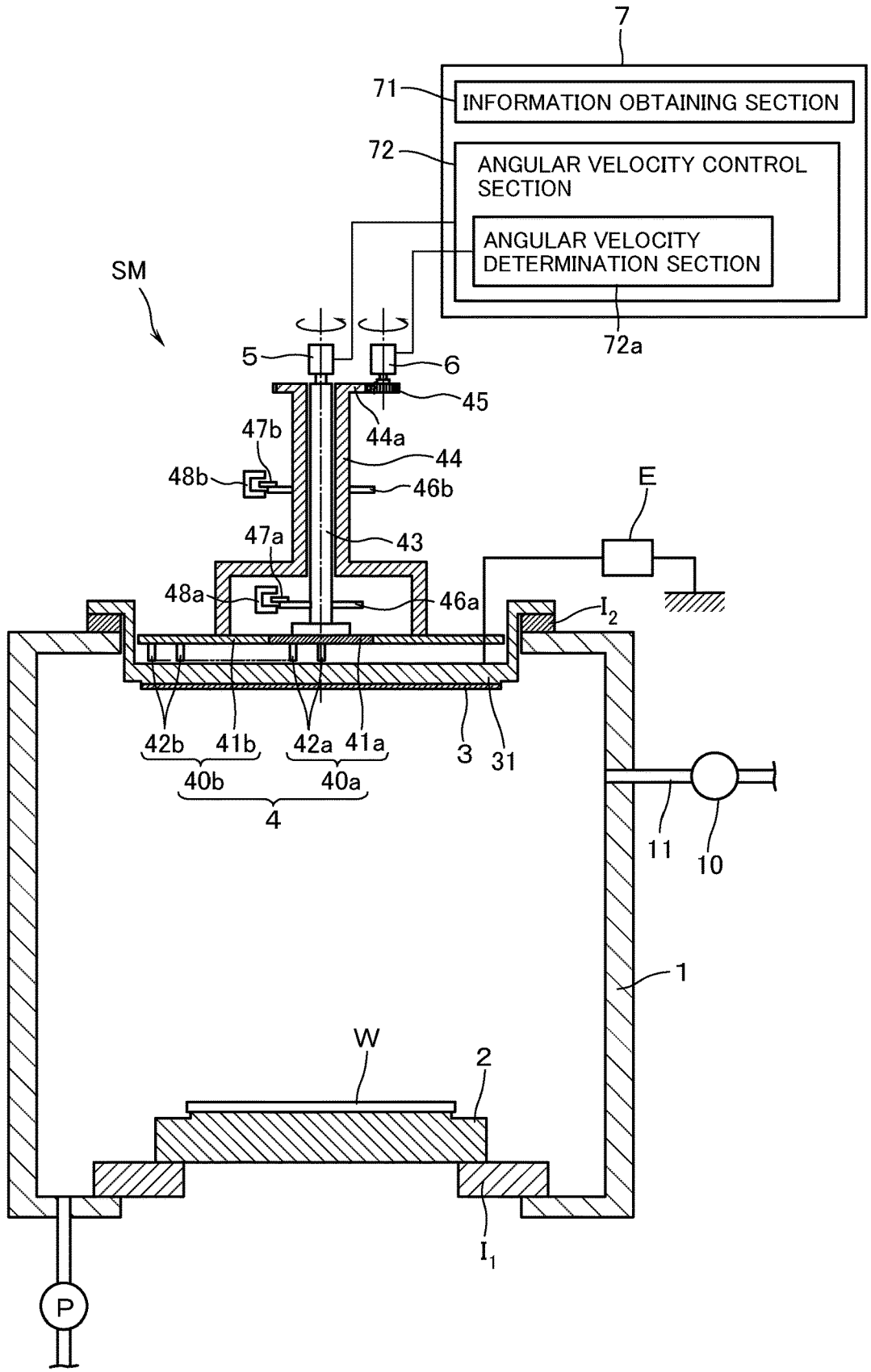
FIG. 1 is a schematic view explaining the construction of a sputtering apparatus according to the present invention.

With reference to FIG. 1, reference mark SM refers to a sputtering apparatus according to this invention. This sputtering apparatus SM is provided with a vacuum chamber 1 which can be evacuated down to a predetermined pressure by a vacuum evacuation means P such as a rotary pump, a turbo molecular pump and the like. A side wall of the vacuum chamber 1 has connected thereto a gas pipe 11 having interposed therein a massflow controller 10 so that a sputtering gas can be introduced from a gas source (not illustrated) into the vacuum chamber 1 at a predetermined flow rate. As the sputtering gas, not only a rare gas such as argon gas and the like, but also a reactive gas such as oxygen-containing gas, and the like shall be understood to be included in case reactive sputtering is performed.

At the bottom of the vacuum chamber 1 there is disposed a stage 2 through an insulating body $1_1$. The stage 2 has a known electrostatic chuck (not illustrated). It is thus so arranged that, by supplying chuck voltage from a chuck power supply to an electrode of the electrostatic chuck, the substrate W can be held by suction on the stage 2 with a film-forming surface of the substrate W facing upward.

In an opening formed in an upper wall of the vacuum chamber 1, there is disposed a cathode unit. The cathode unit has: a target 3 which is disposed in a manner to face the inside of the vacuum chamber 1, the target 3 having an outline which is slightly larger than the outline of the substrate W; and a magnet unit 4 which is disposed above this target 3. The target 3 is disposed so as to lie opposite to the stage 2 and consequently to the substrate W such that the center of the target 3 is positioned on the center line that extends in the vertical direction passing through the center of the substrate W. The target 3 is appropriately selected depending on the composition of the thin film to be formed on the surface of the substrate W, and may be constituted by a simple metal of Cu, Ti, Co, Ni, Al, W or Ta, or an alloy of two or more kinds of the metals selected from the above, or else may be made of an insulation material of aluminum oxide, magnesium oxide and the like. Then, the target 3 is mounted on the vacuum chamber 1 through an insulating plate $I_2$ in a state of being bonded to a copper backing plate 31 which cools the target 3 at the time of film forming, through a bonding material of indium or tin. The target 3 has connected thereto an output from a DC power supply or an AC power supply having a known construction as a sputtering power supply E so that, at the time of sputtering, electric power having a negative electric potential can be supplied. By the way, the sputtering power supply E and the massflow controller 10 correspond to the "plasma generating means" in claims.

By the way, there is a case in which the circumferential film thickness distribution changes at the periphery of the substrate. In such a case, if an adjustment is made of the circumferential film thickness distribution at the outer periphery of the substrate by integrally (i.e., as one set) accelerating or decelerating the magnet unit as in the known example, there is a case in which the film thickness distribution in the inner periphery of the substrate will get all the more deteriorated.

Figure 2:
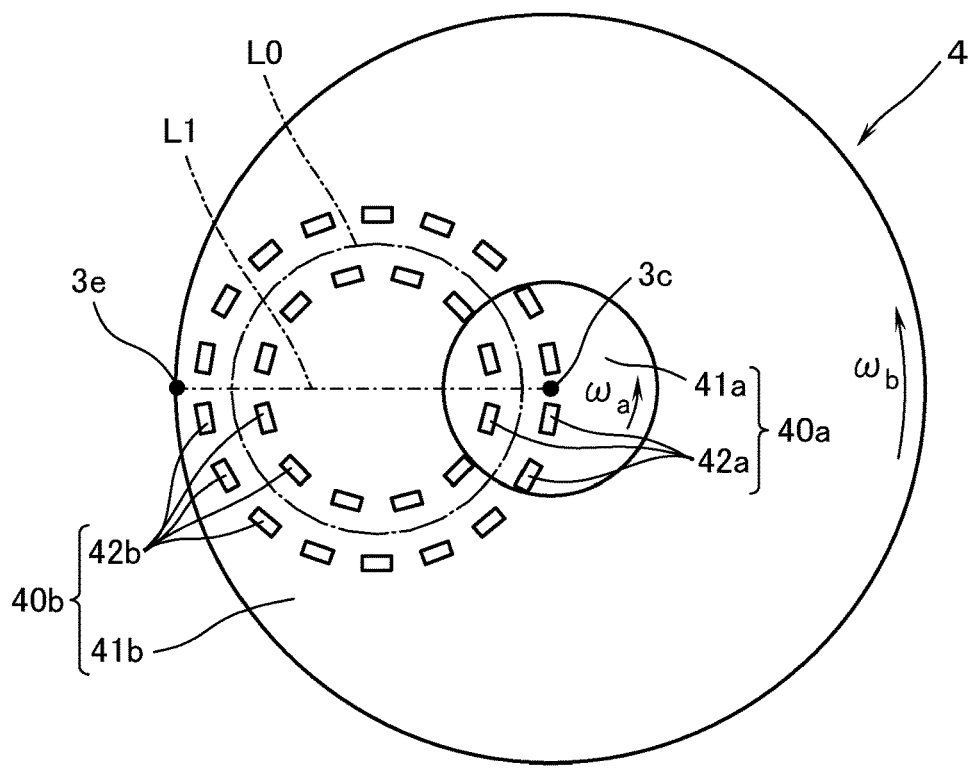
FIG. 2 is a plan view showing the magnet unit 4 shown in FIG. 1, as seen from the lower side.

As a solution, in this embodiment, with reference also to FIG. 2, the magnet unit 4 is divided into a plurality of segments (first and second, i.e., a total of two segments 40a, 40b in this embodiment) on an imaginary line L1 extending from the center 3c of the target 3 to the periphery 3e thereof, each of the segments having a plurality of magnets. The first segment 40a is constituted by: a yoke 41a made of a magnetic material into a circular shape in plan view; and a plurality of magnets 42a disposed on a bottom surface of the yoke 41a while varying the polarities on the lower side of the magnets. To the upper surface of the yoke 41a there is coupled a rotary shaft 43. It is thus so arranged that, by rotating this rotary shaft 43 with a motor 5 as a driving means, the first segment 40a can be driven for rotation with the center 3c of the target 3 serving as the center of rotation. Further, the second segment 40b is constituted by: a yoke 41b made of a magnetic material into an annular shape in plan view, the yoke 41b being disposed on the same plane so as to enclose the yoke 41a; and a plurality of magnets 42b disposed on the bottom surface of the yoke 41b while varying the polarity on the lower side of the magnets. These plurality of magnets 42b and the plurality of magnets 42a in the first segment 40a are disposed in a predetermined pattern such that there is caused to locally act, on such a space below the target as is positioned between the center 3c of the target 3 and the periphery 3e thereof, a leakage magnetic field in which a line L0 passing through a position where a vertical component of the magnetic field becomes zero is closed in an endless manner (see FIG. 3). As to the arrangement of these magnets 42a, 42b, known arrangement having various kinds of embodiments depending on the shape, area, and the like of the target 3 can be utilized. Therefore, a detailed description thereof will be omitted here. To an upper surface of the yoke 41b there is coupled a lower end of a cylindrical member 44 which is disposed on a radially outside of the rotary shaft 43. A gear 45 disposed so as to be in mesh with a flange part 44a that is disposed on an upper end of the cylindrical member 44, is rotated by a motor 6 as a driving means. It is thus so arranged that the second segment 40b can be driven for rotation with the center 3c of the target 3 serving as the center of rotation. The mechanism for driving to rotate each of the first and the second segments 40a, 40b need not be limited to the above, but other known mechanisms may be used.

Further, the rotary shaft 43 and the cylindrical member 44 have inserted on an outside thereof rotary plates 46a, 46b. These rotary plates 46a, 46b have mounted thereon projection pieces 47a, 47b in a manner to protrude radially outward. In this arrangement, optical sensors 48a, 48b are disposed so as to correspond to the projection pieces 47a, 47b, respectively. It is thus so arranged that, when the optical sensors 48a, 48b detect the projection pieces 47a, 47b, judgement can be made that each of the first and the second segments 40a, 40b is in an origin position. In this case, an arrangement is made to obtain information about the film thickness distribution (to be described hereinafter) by correlating the position of the origin and the position of a notch on the substrate W.

The above-mentioned sputtering apparatus SM has a control means 7 provided with a known microcomputer, sequenser, and the like so as to make an overall control over the operation of the sputtering power supply E, the operation of the massflow controller 10, the operations of the motors 5, 6, the operation of the vacuum exhausting means P, and the like.

The control means 7 is provided with an information obtaining section 71, and an angular velocity control means 72. The information obtaining section 71 is constituted to be capable of communication with a film thickness meter provided in an equipment front end module (EFEM) (not illustrated) which serves, e.g., to load/unload a substrate W on/out of the sputtering apparatus SM. It is thus so arranged that the information relating to the in-plane film thickness distribution measured by the thickness meter can be obtained by the information obtaining section 71. The angular velocity control means 72 has an angular velocity determination section 72a which determines the amount of acceleration and the amount of deceleration from the reference angular velocity $\omega_s$ of each of the segments 40a, 40b, based on the obtained information. The motors 5, 6 are driven so that each of the segments 40a, 40b rotates at the determined angular velocities $\omega_a$, $\omega_b$, respectively. By the way, as to the film thickness meter, meters having the known construction may be used. For example, in case a metal film of low resistance value is formed at a relatively thick film thickness, an eddy-current type of film thickness may be utilized and, in case insulation film is formed at a relatively thin film thickness, a spectroscopic ellipsometer may be utilized As another film thickness meter, laser displacement meter may be utilized. A description will hereinafter be made of an embodiment, by using the above-mentioned sputtering apparatus SM, of a method of forming a film according to this invention by taking as an example of forming an aluminum film on the surface of a substrate W.

First, by the vacuum exhausting means P, the inside of the vacuum chamber 1 is evacuated down to a predetermined pressure (e.g., $1\times10^{-5}$ Pa). By means of a transfer robot (not illustrated) a substrate W is transferred into the vacuum chamber 1, and the substrate W is handed over to the stage 2. Then, voltage is applied to the electrode of the chuck plate in the stage 2, thereby holding by suction the substrate W. Subsequently, by means of the mass flow controller 10, argon gas as a sputtering gas is introduced in a predetermined amount (e.g., 100 sccm) (the pressure at this time is 0.1 Pa). By charging the target 3 of aluminum make with, e.g., DC power of 30 kW from the sputtering power supply E, a plasma atmosphere is formed inside the vacuum chamber 1. Also the first segment 40a and the second segment 40b are rotated at least one cycle (one rotation) from the origin position at a predetermined reference angular velocity $\omega_s$ (e.g., 360 deg./sec) by synchronizing the first segment 40a and the second section 40b with each other. According to this arrangement, the target 3 gets sputtered, and the sputtered particles scattered from the target 3 will get adhered to, and deposited on, the surface of the substrate W, thereby forming an aluminum film. The substrate W on which a film has been formed is taken out of the vacuum chamber 1 and measurement is made by a film thickness meter (not illustrated) of the film thicknesses of the aluminum film at a plurality of in-plane points of the substrate W, thereby obtaining information about the in-plane film thickness distribution of the substrate. The obtained information is transmitted to the information obtaining section 71 of the control means 7, and the information obtaining section 71 obtains the information in question (information obtaining step).

Then, based on such information about the film thickness distribution as was obtained in the information obtaining step, the angular velocity of each of the first and the second segments 40a, 40b is respectively determined within a range in which the endless manner of the leakage magnetic field is maintained (angular velocity determining step). In this angular velocity determining step, an orbit (circumference) of each of the first and the second segments 40a, 40b in one cycle is uniformly and circumferentially partitioned (e.g., the rotational movement of 360° is partitioned into 24 sections of every 15°). Each of the divided sections is respectively defined as a zone, and the position of the origin at which the optical sensors 48a, 48b detected the projection pieces 47a, 47b, respectively, is defined as a reference zone. Then, the angular velocity at this reference zone is defined as a reference angular velocity $\omega_s$ and, for each of the zones other than the reference zone, an amount of acceleration or an amount of deceleration from the reference angular velocity $\omega_s$ is determined based on the above-mentioned obtained information. It is to be noted here that, in a zone where the film thickness is smaller than that in the reference zone, by decelerating the angular velocity $\omega_a$, $\omega_b$ in each of the segments 40a, 40b by a predetermined value from the reference angular velocity $\omega_s$, the amount in which the target 3 gets sputtered (sputtering rate) is increased. On the other hand, in a zone where the film thickness is larger than that in the reference zone, by accelerating the angular velocity $\omega_a$, $\omega_b$ in each of the segments 40a, 40b by a predetermined value from the reference angular velocity $\omega_s$, the sputtering rate is decreased.

After having determined, in the above-mentioned angular velocity determining step, the zone-by-zone angular velocity $\omega_a$, $\omega_b$ in each of the segments 40a, 40b, the substrate W is transferred into the vacuum chamber 1 and is held by suction on the stage 2. While driving to rotate each of the segments 40a, 40b at the determined angular velocity $\omega_a$, $\omega_b$, an aluminum film is formed on the surface of the substrate W on the same conditions as above (film forming step).

Figure 3:
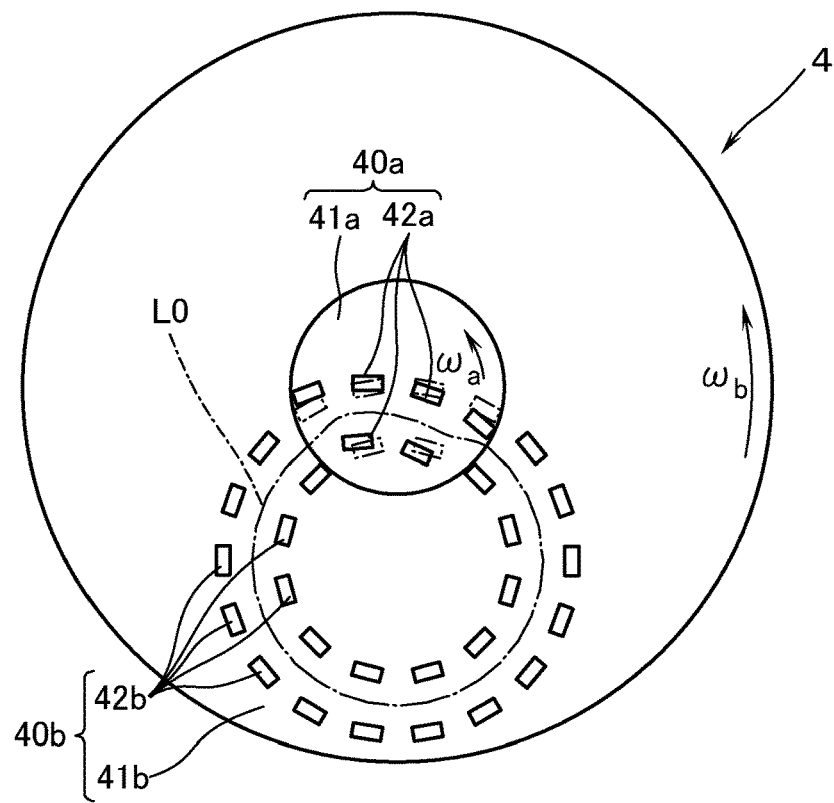
FIG. 3 is a plan view showing the state in which the angular velocity of the first segment 40a of the magnet unit 4 is made slower than the angular velocity of the second segment 40b.

According to the above arrangement, an arrangement has been employed in which, when each of the segments 40a, 40b of the magnet unit 4 respectively moves on the same orbit around the target 3, the angular velocity $\omega_a$, $\omega_b$ can be controlled for each of the segments 40a, 40b by the angular velocity control means 72. Therefore, by adjusting the circumferential film thickness distribution at the outer periphery of the substrate, should the circumferential film thickness distribution deteriorate on the inside of the inner periphery of the substrate, the first segment 40a of the magnet unit that will cause to act such a leakage magnetic field as will contribute to the film formation in the inner periphery of the substrate can be managed in the following manner, i.e.: regarding the region in which the circumferential film thickness is relatively small, the angular velocity $\omega_a$ is decelerated to thereby increase the sputtering rate; on the other hand, regarding the region in which the film thickness is relatively large, the angular velocity $\omega_a$ is accelerated to thereby reduce the sputtering rate. In the above-mentioned arrangement, the film thickness distribution at the portion where the film thickness distribution has been deteriorated can be re-adjusted. As a result, all the more uniform film thickness distribution can be obtained over the entire surface of the substrate. By the way, FIG. 3 shows a state in which, in order to increase the sputter rate in the inner periphery of the substrate, the angular velocity $\omega_a$ of the first segment 40a of the magnet unit 4 is made smaller (slower) than the angular velocity $\omega_b$ of the second segment 40b.

Next, experiments were carried out by using the above-mentioned sputtering apparatus SM in order to confirm the effect of this invention. The substrate W was made to be a silicon wafer of Φ300 mm (in diameter). Argon gas was introduced into the vacuum chamber 1 in an amount of 100 sccm (the pressure at this time was 0.1 Pa), and DC power of 30 kW was applied to the target 3 of aluminum make to thereby generate a plasma atmosphere. While driving to rotate in synchronization the first segment 40a and the second segment 40b of the magnet unit 4, an aluminum film was formed on the surface of the substrate W. Then, the film thicknesses were measured by a film thickness meter at a plurality of in-plane positions of the substrate W, thereby obtaining the information about the in-plane film thickness distribution of the substrate. According to the information, the maximum value of the circumferential film thickness at the outer periphery of the substrate (an imaginary circle of 147 mm in radius) was 40.79 nm, the minimum value was 38.9 nm, and the difference between the maximum value and the minimum value (this difference is hereinafter called "range") was 1.89 nm. On the other hand, the maximum value of the circumferential film thickness in the inner periphery of the substrate (an imaginary circle of 98 mm in radius) was 40.65 nm, the minimum value was 38.9 nm, and the range was 1.55 nm.

When the angular velocities $\omega_b$ of the second segment 40b of the magnet unit 4 were determined for 24 respective zones, and the circumferential film thickness distribution at the outer periphery of the substrate was adjusted. As a result, the maximum value of the circumferential film thickness at the outer periphery of the substrate was 40.96 nm, the minimum value was 39.73 nm. While the range became smaller to 1.23 nm, the maximum value of the circumferential film thickness in the inner periphery of the substrate was 42.56 nm, and the minimum value was 39.73 nm, with the result that the range was deteriorated to 2.83 nm. Then, when the angular velocities $\omega_a$ at the first segment 40a of the magnet unit 4 were determined for 24 respective zones, the maximum value of the circumferential film thickness in the inner periphery of the substrate was 40.06 nm, the minimum value was 39.76 nm, and the range was 0.87 nm. The maximum value of the circumferential film thickness at the outer periphery of the substrate was 40.09 nm, the minimum value was 39.76 nm, and the range was 0.33 nm. According to these experiments, the film thickness distribution in the inner periphery of the substrate where the film thickness distribution was deteriorated, can be readjusted. As a result, it has been confirmed that a further uniform film thickness distribution can be obtained over the entire surface of the substrate.

Descriptions have so far been made of the embodiment of this invention, but this invention shall not be limited to the above. In the above-mentioned embodiment, in case the film thickness in each zone is smaller (or larger) than the film thickness in the reference zone, a description was made of a case in which deceleration (or acceleration) is made from the reference angular velocity by a predetermined value. Otherwise, the following arrangement may also be made: i.e., average circumferential value of film thicknesses in all zones (total average film thickness) is obtained, and a ratio of this total average film thickness to an average value of the film thickness in each zone (zone average film thickness) is obtained; in a zone in which the obtained ratio is low (i.e., a zone in which zone average film thickness is smaller than the total average film thickness), while the angular velocity of the magnet unit 4 is decelerated by a predetermined value from the reference angular velocity; in a zone in which the obtained ratio is high (i.e., the zone average film thickness is larger than the total average film thickness), the angular velocity of the magnet unit 4 is accelerated by a predetermined value from the reference angular velocity. The angular velocity in each zone can be determined, e.g., by employing the following formula (1).

Angular velocity in each zone=reference angular velocity+coefficient×(zone average film thickness−total average film thickness)/total average film thickness    (1)

In the above formula (1) one coefficient was used, but coefficient may be provided in each of the zones. In this case, by setting two conditions or more (e.g., three conditions of low velocity, medium velocity and high velocity) as the reference angular velocity of the magnet unit 4 so as to obtain a correlation value between the velocity of the magnet unit and the film thickness, the accuracy of the coefficient can be increased.

In the above-mentioned embodiment, a description was made of an example in which the angular velocity at each of the segments 40a, 40b was determined based on the film thicknesses. The angular velocity at each of the segments 40a, 40b may alternatively be determined based on the information having correlation with the film thicknesses. For example, a target voltage to be supplied to the target 3 when a predetermined charge voltage is applied to the target 3, is measured for each of the zones and, based on the measured target voltage, the angular velocity at each of the segments 40a, 40b may be determined. In this case, an arrangement may be made such: that the target voltage corresponding to each of the zones is obtained; that an average value (average voltage) of the target voltages in all zones inclusive of the reference zone is obtained; and that a ratio of the target voltages correlated with each of the zones to the average voltage is obtained. An amount of acceleration or an amount of deceleration from the reference angular velocity may be determined such that the angular velocity in each of the segments 40a, 40b is decelerated in a zone of high ratio, and that the angular velocity of each of the segments 40a, 40b is accelerated in a zone of low obtained ratio (velocity determining step).

Further, a magnetic field strength distribution (synthesis of magnetic field vectors of three axes) of vertical magnetic field in the endless manner can be varied in the neighborhood of each of the segments 40a, 40b by an angular difference Δθ in each of the segments 40a, 40b (i.e., provided that the first segment 40a, e.g., is made to be the reference, a circumferential amount of deviation of the second segment 40b relative to the first segment 40a). Therefore, by measuring in advance the angular difference Δθ and the corresponding shape of film thickness distribution, an adjustment may be made to the angular difference Δθ in which the film thickness distribution can be improved. In this case, an adjustment may be made to the angular difference Δθ to conform to the amount of consumption of the target or to the amount of power supply to the target. The film thickness distribution can be improved by combining the processing to one substrate under a plurality of angular difference conditions by combining in a continuous film forming or in a discontinuous film forming.

Figure 4A:
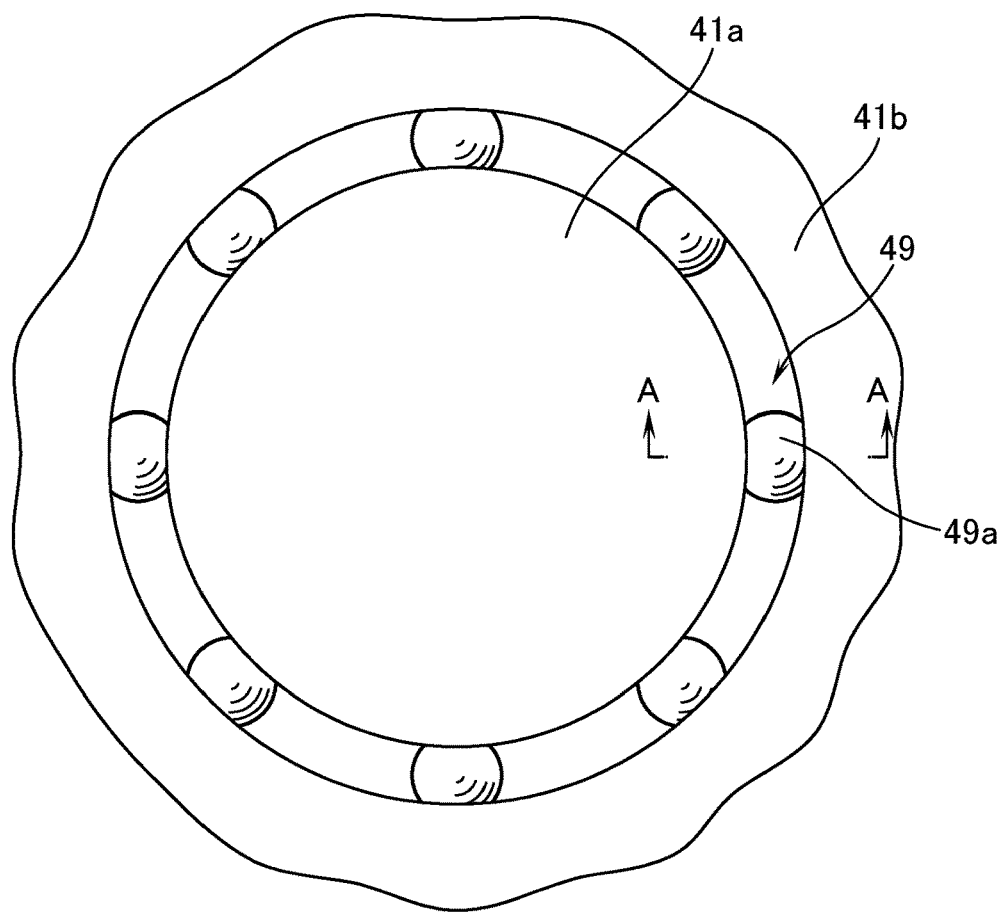
FIG. 4(a) is a plan view showing in enlargement an essential portion of a modified embodiment of the magnet unit.
Figure 4B:
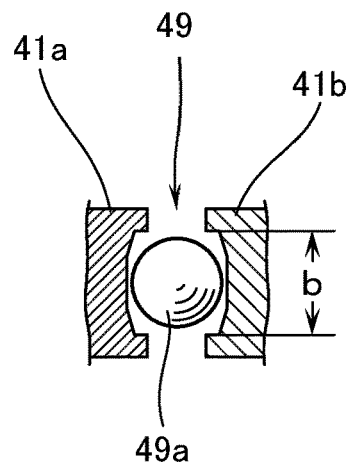
FIG. 4(b) is a sectional view taken along the line A-A in FIG. 4(a).
Figure 5A:
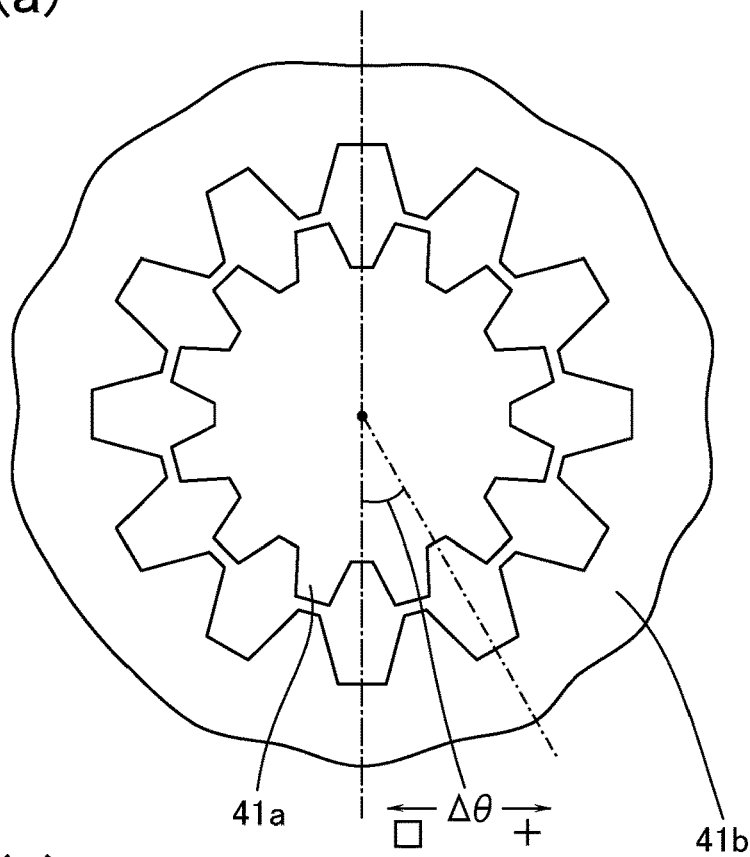
FIG. 5 is a plan view showing in enlargement an essential portion of another modified example of the magnet unit.
Figure 5B:
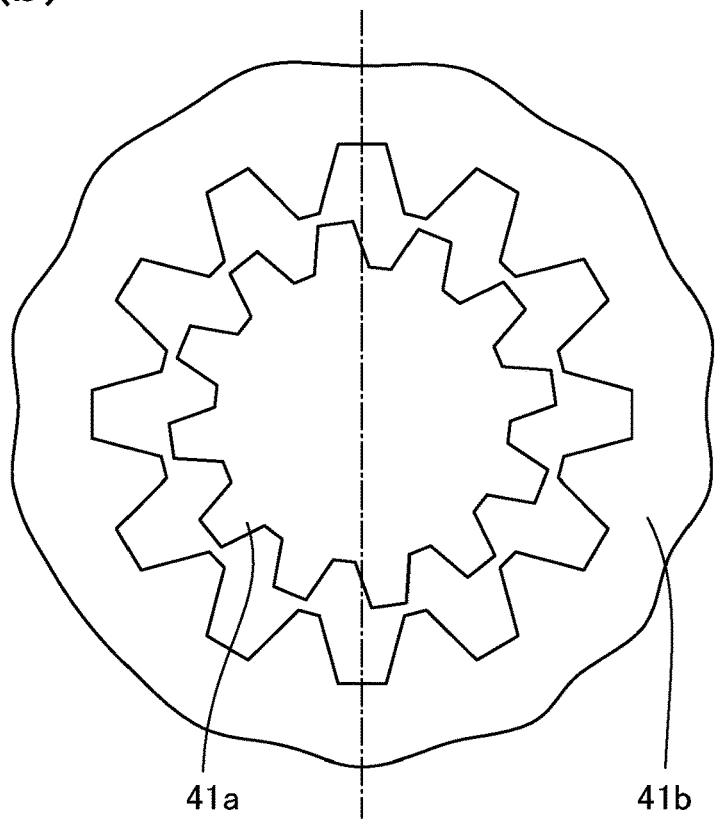
Figure 6:
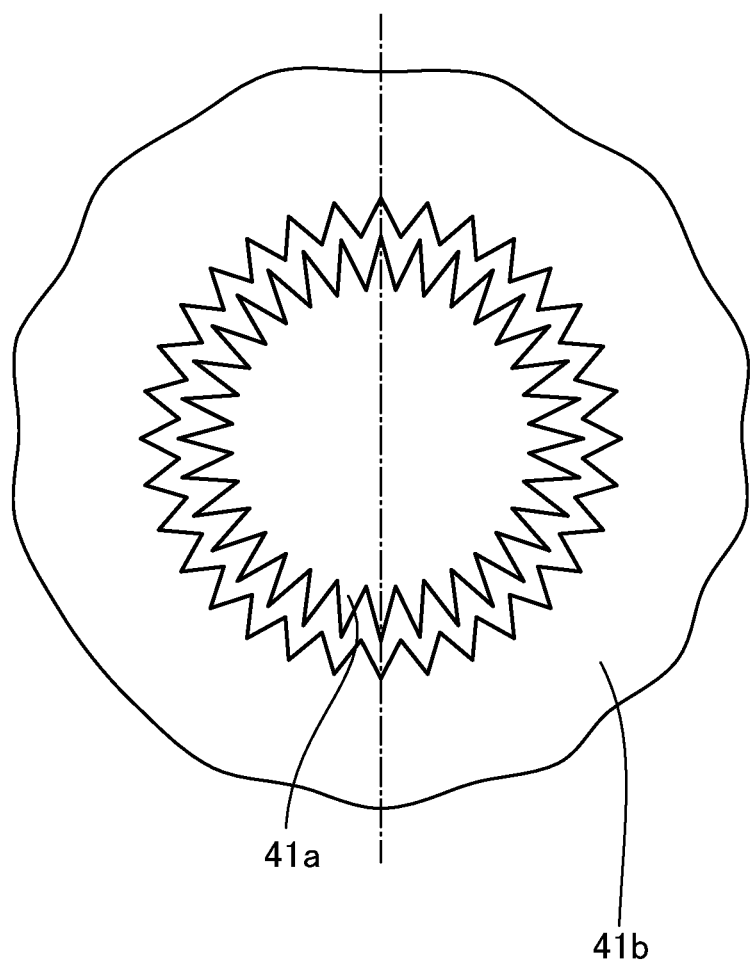
FIG. 6 is a plan view showing in enlargement an essential portion of still another modified example of the magnet unit.

By the way, due to the difference between the permeability of yokes 41a, 41b of respective segments 40a, 40b and the permeability in space between the yokes 41a, 41b, there is a case in which the magnetic field that is generated from the yoke surface of the magnet and has been converged may be dispersed if the distance between the yokes 41a, 41b gets larger. As a result of this, if the circumferential distance between the yokes 41a, 41b is nonuniform, there is a possibility that the film thickness distribution may fluctuate. Therefore, in order to make uniform the circumferential distance between the yokes 41a, 41b, the space between the yokes 41a, 41b shall preferably be formed into a bearing construction 49 as shown in FIG. 4. In this case, the material of balls 49a of the bearing construction 49 shall preferably be non-magnetic material such as ceramics and the like. Although the material of the balls 49a can be made of a magnetic material, in such a case, preferably the dimension "b" (see FIG. 4(b)) in the vertical direction of the space which is formed in a recessed manner in the opposite peripheral surfaces of the yokes 41a, 41b so as to hold balls 49 shall be made small (as a result, the space in question is made narrower), or shall employ a construction of disposing the balls 49 more closely in the circumferential direction. In addition, as shown in FIG. 5(a), the outer peripheral surface of the yoke 41a and the inner peripheral surface of the yoke 41b may be formed respectively into tooth shape of non-contact with each other. According to this arrangement, within a narrow adjustment range to keep an endless manner, the ratio of the magnetic field to pass through the space between the yokes 41a, 41b can be adjusted. In this case, in order to adjust the ratio of the magnetic field that passes through the space between the yokes 41a, 41b while maintaining the same magnetic field, as shown in FIG. 5(a), provided that the point at which the change in the magnetic field becomes symmetric in whichever plus or minus (±) directions the angular difference Δθ of 40a, 40b may be moved is defined as an intermediate point (at this time the amount of permeability becomes 50% of the maximum amount of permeability), as shown in FIG. 5(b), the space between the yokes 41a, 41b is made bilaterally symmetric, whereby the ratio of the magnetic field to pass through this bilaterally symmetric space is made to be bilaterally symmetrical. Alternatively, as shown in FIG. 6, by changing the ratio of number of tooth between 41a, 41b, it may be so arranged that an adjustment can be made by slightly changing an angle of the yokes 41a, 41b (e.g., by changing the angle by a single number of tooth of the yoke 41a) within a range in which the change is small in the magnetic field strength distribution of the vertical magnetic field in the endless manner due to an angular difference Δθ in each of the segments 40a,40b.

EXPLANATION OF MARKS

| E | sputtering power supply (plasma generating means) | | |
|---|---|---|---|
| W | substrate | 1 | vacuum chamber |
| 3 | target | 3c | center of target |
| 3e | periphery of target | 4 | magnet unit |
| 10 | massflow controller (plasma generating means) | | |
| 40a | first segment | 40b | second segment |
| 42a, 42b | magnet | 5, 6 | drive means |
| 72 | angular velocity control means | | |

The invention claimed is:
1. A sputtering apparatus comprising:
a vacuum chamber in which a substrate to be processed and a target are disposed to lie opposite to each other;

a plasma generating means for generating a plasma inside the vacuum chamber; and provided that a direction inside the vacuum chamber from the substrate toward the target is defined to be upward, a magnet unit disposed above the target, wherein the magnet unit has a plurality of magnets with different polarities on a substrate side, and a leakage magnetic field in which a line passing through a position where a vertical component of the magnetic field becomes zero is closed in an endless manner, is caused to locally act on such a space below the target as is positioned between a center of the target and a periphery thereof, wherein the magnet unit is divided, on an imaginary line extending from the center of the target toward the periphery thereof, into a plurality of segments each segment having a plurality of magnets, the magnet unit comprising:

driving means corresponding to each of the segments for driving to rotate the plurality of the segments about the center of the target; and an angular velocity control means for controlling the angular velocity of each of the plurality of the segments within a range of maintaining the endless manner of the leakage magnetic field.

2. A method of forming a film in which a substrate to be processed and a target are disposed to lie opposite to each other inside a vacuum chamber, and by generating a plasma inside the vacuum chamber, the target is sputtered to thereby form a thin film on a surface of the substrate, wherein, provided that a direction inside the vacuum chamber from the substrate toward the target is defined to be upward, during film forming by means of a magnet unit disposed above the target, a leakage magnetic field in which a line passing through a position where a vertical component of the magnetic field becomes zero is closed in an endless manner, is caused to locally act on such a space below the target as is positioned between a center of the target and a periphery thereof, the method comprising:

an information obtaining step in which by using, as the magnet unit, a plurality of segments divided on an imaginary line extending from a center of the target toward a periphery thereof, each of the plurality of the segments being driven by driving means corresponding to each of the segments for rotating each of the plurality of the segments in synchronization about the center of the target, thereby forming a thin film on the surface of the substrate, and obtaining information about an in-plane film thickness distribution of the substrate;

an angular velocity determining step in which, based on such information about film thickness distribution as was obtained in the information obtaining step, an angular velocity of each of the plurality of the segments is respectively determined to a different angular velocity within a range in which the endless manner of the leakage magnetic field is maintained; and a film forming step in which a thin film is formed on the surface of the substrate by driving driving means corresponding to each of the segments to rotate each of the plurality of the segments of the magnet unit at a different rotational speed determined in the angular velocity determining step.

3. The film forming method according to claim 2, wherein, during film forming, a cycle in which a region of locally acting the leakage magnetic field on the target moves on a same orbit from an origin back to the origin is performed at least more than once and, in the information obtaining step, the information is obtained about a film thickness distribution at the time of forming a thin film by rotating each of the plurality of the segments of the magnet unit at a predetermined reference angular velocity and, in the angular velocity determining step, the orbit of each of the plurality of the segments of the magnet unit in one cycle is divided into a plurality of respective zones, at least one zone being defined as a respective reference zone and, for each of the zones other than the reference zone, an amount of acceleration or an amount of deceleration from the reference angular velocity is respectively determined based on such information about the film thickness distribution as was obtained in the information obtaining step.

* * * * *